US008573756B2

(12) United States Patent
Suzuki

(10) Patent No.: US 8,573,756 B2
(45) Date of Patent: Nov. 5, 2013

(54) INK-JET HEAD AND METHOD OF MANUFACTURING THE SAME

(75) Inventor: Isao Suzuki, Shizuoka (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 137 days.

(21) Appl. No.: 13/029,735

(22) Filed: Feb. 17, 2011

(65) Prior Publication Data

US 2012/0098897 A1 Apr. 26, 2012

(30) Foreign Application Priority Data

Oct. 26, 2010 (JP) ................................ 2010-240034

(51) Int. Cl.
*B41J 2/045* (2006.01)
*H01L 41/22* (2013.01)

(52) U.S. Cl.
USPC ........................................... 347/71; 29/25.35

(58) Field of Classification Search
USPC ..................................................... 347/69, 45
See application file for complete search history.

(56) References Cited

U.S. PATENT DOCUMENTS 6,520,617 B2 * 2/2003 Blair .............................. 347/20
6,547,374 B2 4/2003 Shimosato et al.
6,582,057 B2 6/2003 Suzuki
2007/0211118 A1 * 9/2007 Nishimura et al. ............. 347/72
2011/0134196 A1 * 6/2011 Kim et al. ....................... 347/71

FOREIGN PATENT DOCUMENTS

JP 07-329293 12/1995
JP 2000-263794 9/2000
JP 2003266691 A * 9/2003
JP 2004-42399 2/2004
JP 3943971 B2 7/2007

OTHER PUBLICATIONS

Office Action dated Jan. 22, 2013 for counterpart Japanese Application No. 2010-240034.

* cited by examiner

*Primary Examiner* — Lisa M Solomon
(74) *Attorney, Agent, or Firm* — Patterson & Sheridan, L.L.P.

(57) ABSTRACT

According to one embodiment, an ink-jet head includes a piezoelectric member which forms an ink pressure chamber, an electrode disposed on a side surface of the piezoelectric member, a nozzle plate attached to the piezoelectric member and including a nozzle hole communicating with the ink pressure chamber, a surface of the nozzle plate including a top surface of the nozzle plate, and a protection film which covers the surface of the nozzle plate, a peripheral portion of an adhesion part between the piezoelectric member and the nozzle plate, and the electrode. A recess is formed in a part of the protection film covering the top surface of the nozzle plate. The part of the protection film corresponds to a peripheral area of the nozzle hole.

14 Claims, 7 Drawing Sheets

INK-JET HEAD AND METHOD OF MANUFACTURING THE SAME

CROSS-REFERENCE TO RELATED APPLICATIONS

This application is based upon and claims the benefit of priority from Japanese Patent Application No. 2010-240034, filed Oct. 26, 2010; the entire contents of which are incorporated herein by reference.

FIELD

Embodiments described herein relate generally to an ink-jet head and a method of manufacturing the ink-jet head.

BACKGROUND

In recent years, ink-jet heads which discharge various kinds of ink, such as electrically conductive ink, have been put to practical use. In such ink-jet heads, it is necessary to protect an electrode, etc. from ink. In addition, in an ink-jet head which discharges special kind of ink, such as solvent ink, there arises such a problem that an adhesive, which attaches a nozzle plate and a piezoelectric member, is degraded by the ink. It is necessary, therefore, to protect those parts of the ink-jet head, which have poor ink resistance properties.

To meet such a demand, techniques have been studied for coating an electrode, a nozzle plate, etc. with a protection film which is formed of a high-molecular-weight material. However, when a growth variance of a protection film has occurred in an edge portion of a nozzle hole in the nozzle plate, there may occur such a problem that a variance also occurs in ink discharge performance.

If the protection film has abnormally grown at the edge portion of the nozzle hole, the abnormal growth point (projection) adversely affects ink drops at the time of ink discharge, leading to a decrease in print quality. For example, if the direction of discharge of an ink drop is inclined, an error occurs in the position of a dot which is formed on a medium by the ink drop. In addition, in the case where a main ink drop, which is to be discharged, has trailed and a small ink drop (satellite) has occurred, the satellite may fly in a direction different from the direction of the main ink drop, and a small dot, which is formed by the small ink drop, may be printed on the medium in addition to the main dot which is formed by the main ink drop.

DETAILED DESCRIPTION

Figure 1:
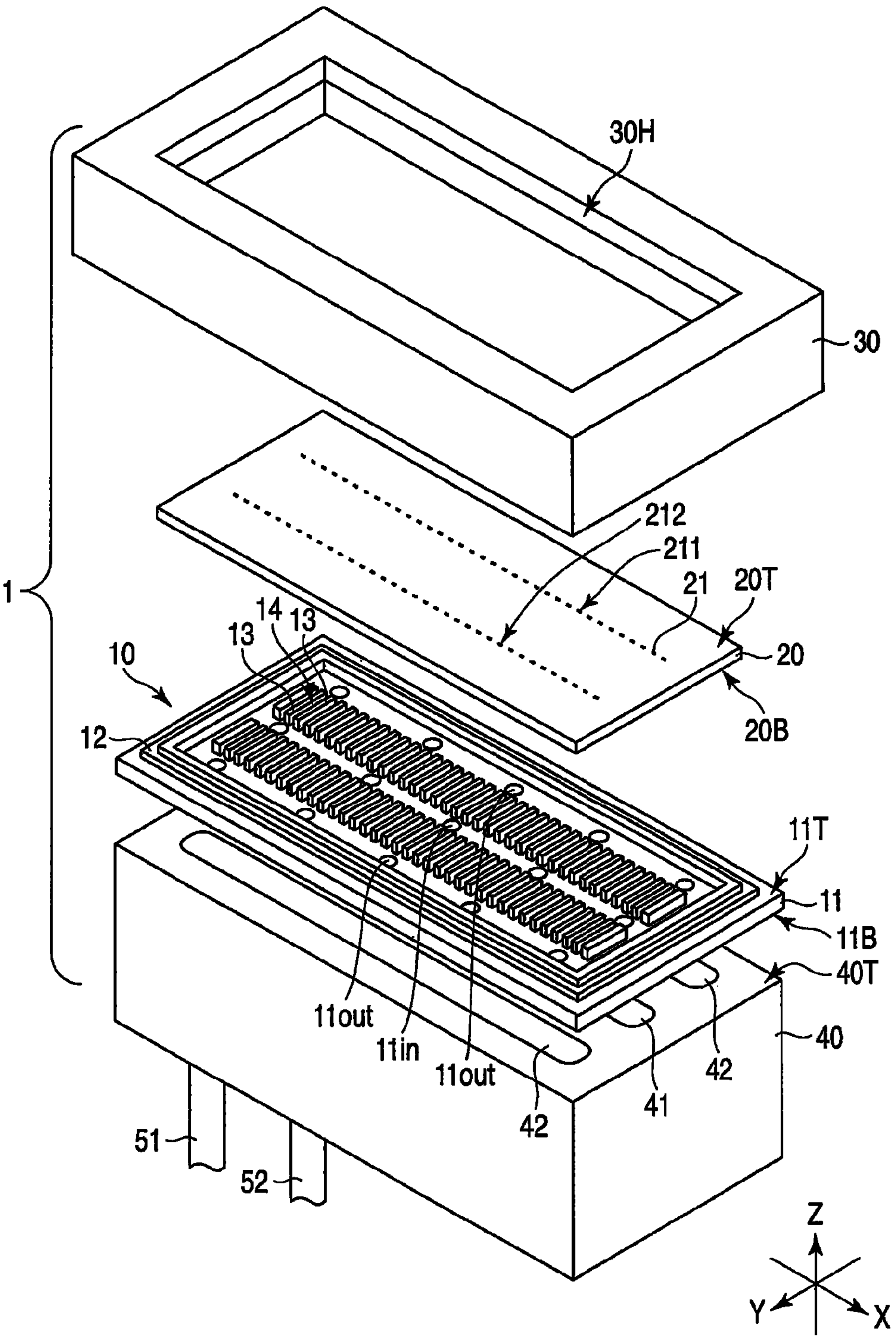
FIG. 1 is an exploded perspective view which schematically shows the structure of an ink-jet head in an embodiment.

In general, according to one embodiment, an ink-jet head includes a piezoelectric member which forms an ink pressure chamber; an electrode disposed on a side surface of the piezoelectric member; a nozzle plate attached to the piezoelectric member and including a nozzle hole communicating with the ink pressure chamber, a surface of the nozzle plate including a top surface of the nozzle plate; and a protection film which covers a surface of the nozzle plate, a peripheral portion of an adhesion part between the piezoelectric member and the nozzle plate, and the electrode. A recess is formed in a part of the protection film covering the top surface of the nozzle plate. The part of the protection film corresponds to a peripheral portion of the nozzle hole.

In general, according to another embodiment, an ink-jet head includes a piezoelectric member which forms an ink pressure chamber; an electrode disposed on a side surface of the piezoelectric member; a nozzle plate attached to the piezoelectric member and including a nozzle hole communicating with the ink pressure chamber; and a protection film which covers a surface of the nozzle plate, a peripheral portion of an adhesion part between the piezoelectric member and the nozzle plate, and the electrode. At least a part of a top surface of the nozzle plate is exposed from the protection film. The part of the top surface corresponds to a peripheral area of the nozzle hole.

In general, according to another embodiment, a method of manufacturing an ink-jet head includes forming a piezoelectric member which forms an ink pressure chamber, and an electrode disposed on a side surface of the piezoelectric member; attaching the piezoelectric member and a nozzle plate; forming a protection film which covers a surface of the nozzle plate, a peripheral portion of an adhesion part between the piezoelectric member and the nozzle plate, and the electrode; and removing at least a part of the protection film covering a top surface of the nozzle plate by radiating a laser beam at a peripheral area of a nozzle hole.

An embodiment will now be described with reference to the accompanying drawing. In the drawings, structural elements having the same or similar functions are denoted by like reference numerals, and an overlapping description thereof is omitted.

FIG. 1 is an exploded perspective view which schematically shows the structure of an ink-jet head 1 in the embodiment.

Specifically, the ink-jet head 1 comprises a main module 10, a nozzle plate 20, a mask plate 30 and a holder 40. The ink-jet head 1 has a substantially rectangular shape, the longitudinal direction of which is set in a first direction X. In the description below, a direction which is substantially perpendicular to the first direction X is defined as a second direction Y, and a direction perpendicular to an X-Y plane is defined as a third direction Z. The direction of discharge of ink drops is the third direction Z.

The main module 10 is configured to include an insulative substrate 11, a frame body 12 and piezoelectric members 13.

The insulative substrate 11 is formed of ceramics such as alumina, and is formed in a substantially rectangular shape extending in the first direction X. The insulative substrate 11 has a top surface 11T on a side facing the nozzle plate 20, and a back surface 11B on a side facing the holder 40. The insulative substrate 11 includes ink supply ports 11in and ink exhaust ports 11out. The ink supply ports 11in and ink exhaust ports 11out penetrate from the top surface 11T to the back surface 11B.

The frame body 12 is formed of, e.g. a metal, and is formed in a rectangular frame shape. The frame body 12 is disposed on the top surface 11T of the insulative substrate 11. The piezoelectric members 13 are formed of, e.g. PZT (lead zirconate titanate), and are disposed in an inside area surrounded by the frame body 12 on the top surface 11T of the insulative substrate 11. Each of the piezoelectric members 13 extends in the second direction Y which is substantially perpendicular to the first direction X. The piezoelectric members 13 are arranged in the first direction X. Ink pressure chambers 14 each extending in the second direction Y are formed in the form of slits between pairs of piezoelectric members 13 arranged in the first direction X.

In the example illustrated, two strings of piezoelectric members 13 are arranged in the first direction X. The ink supply ports 11in are arranged in the first direction X at a substantially central part of the insulative substrate 11, that is, between the two strings of piezoelectric members 13. The ink exhaust ports 11out are arranged in the first direction X at peripheral parts of the insulative substrate 11, that is, between the piezoelectric members 13 and the frame body 12. By this structure, ink is supplied from the ink supply ports 11in to the ink pressure chambers 14, and the ink, which passes through the ink pressure chambers 14, is exhausted from the ink exhaust ports 11out.

The nozzle plate 20 is formed, for example, of a resin such as polyimide, or of a heat-resistant metal such as a nickel alloy or stainless steel, and is formed in a substantially rectangular plate shape extending in the first direction X. The nozzle plate 20 is disposed above the main module 10 along the third direction Z. The nozzle plate 20 has a top surface 20T on a side facing the mask plate 30, and a back surface 20B on a side facing the main module 10. The back surface 20B of the nozzle plate 20 is attached to the frame body 12 and piezoelectric members 13 by an adhesive.

The nozzle plate 20 has nozzle holes 21. Each nozzle hole 21 is formed so as to face the ink pressure chamber 14, and communicates with the ink pressure chamber 14. The nozzle holes 21 are arranged substantially in the first direction X, and constitute nozzle strings 211 and 212. In the example illustrated, the number of nozzle strings may be one, or three or more. Strictly speaking, there are cases in which mutually neighboring nozzle holes 21 are not formed on the same straight line in the first direction X, but a detailed description regarding such cases is omitted here.

The mask plate 30 is formed of, for example, a metal, and is formed in a frame shape surrounding the nozzle plate 20. The mask plate 30 is disposed above the main module 10 along the third direction Z. The mask plate 30 includes a substantially rectangular opening portion 30H which substantially corresponds to the outer size of the nozzle plate 20. The mask plate 30 and the frame body 12 are attached by an adhesive.

The holder 40 is disposed under the main module 10 along the third direction Z. The holder 40 includes an ink introducing path 41 for introducing ink into the ink supply ports 11in, and ink recovery paths 42 for recovering the ink which is exhausted from the ink exhaust ports 11out. An introducing pipe 51 for introducing ink from an ink tank (not shown) is connected to the ink introducing path 41. A recovery pipe 52 for recovering ink into the ink tank is connected to the ink recovery paths 42. The holder 40 has a top surface 40T on a side facing the main module 10. The top surface 40T of the holder 40 and the back surface 11B of the insulative substrate 11 are attached by an adhesive.

A thermosetting resin, such as epoxy resin, is applicable, for example, to the adhesive which attaches the holder 40 and insulative substrate 11, the adhesive which attaches the nozzle plate 20 to the frame body 12 and piezoelectric members 13, and the adhesive which attaches the mask plate 30 and frame body 12.

Figure 2:
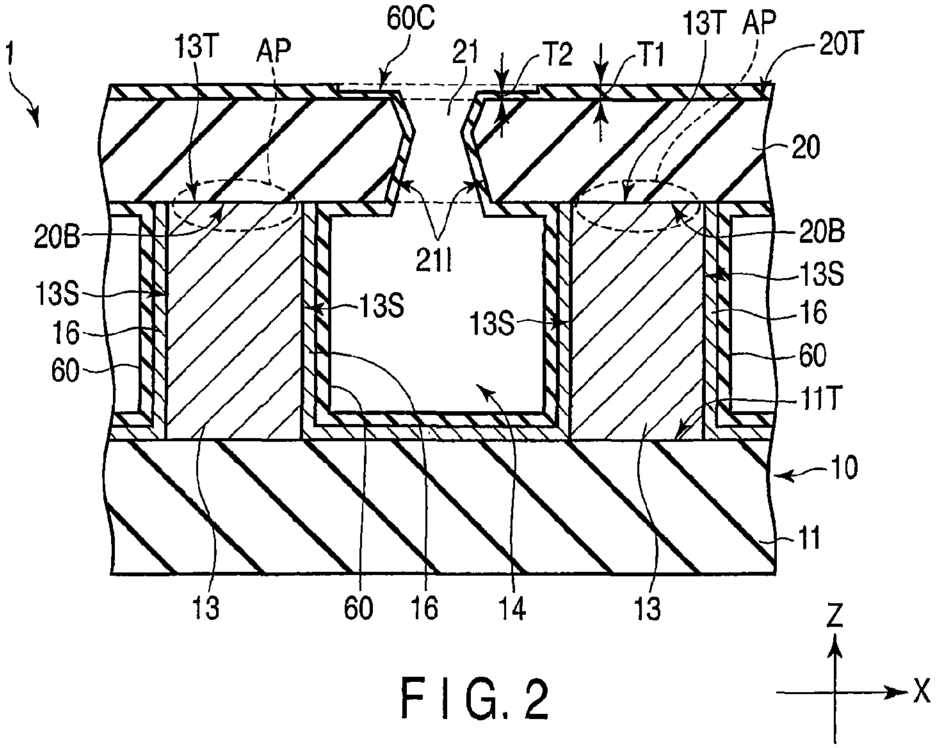
FIG. 2 is a cross-sectional view which schematically shows a first structure example including a main module and a nozzle plate, which constitute the ink-jet head shown in FIG. 1.

FIG. 2 is a cross-sectional view which schematically shows a first structure example including the main module 10 and nozzle plate 20, which constitute the ink-jet head 1 shown in FIG. 1.

Specifically, the piezoelectric members 13 are disposed with a predetermined interval in the first direction X, on the top surface 11T of the insulative substrate 11. Although a detailed description is omitted, the piezoelectric member 13 is formed, for example, by stacking, in the third direction Z, two piezoelectric members having mutually opposite polarization directions. The piezoelectric member 13 has a top surface 13T, and side surfaces 13S which are substantially perpendicular to the top surface 11T of the insulative substrate 11.

The ink pressure chamber 14 is formed between the mutually neighboring piezoelectric members 13. In other words, the piezoelectric members 13 are disposed, with the ink pressure chamber 14 being interposed.

Electrodes 16 are disposed on the side surfaces 13S of the piezoelectric members 13. Specifically, the piezoelectric member 13 is sandwiched between two electrodes 16. The electrode 16 is also disposed on the top surface 11T of the insulative substrate 11, which is positioned between the neighboring piezoelectric members 13. The electrode 16 is formed by, for example, nickel plating or copper plating.

The nozzle plate 20 is attached to the piezoelectric members 13. To be more specific, the top surface 13T of the piezoelectric member 13 and the back surface 20B of the nozzle plate 20 are attached by an adhesive. The nozzle hole 21, which is formed in the nozzle plate 20, communicates with the ink pressure chamber 14. The center of the nozzle hole 21 is located at substantially middle point between the mutually neighboring piezoelectric members 13.

In this structure, voltages of opposite polarities are applied to the electrodes 16 which sandwich the piezoelectric member 13. Thereby, the piezoelectric member 13 deforms, and varies the capacity of the ink pressure chamber 14 (i.e. increases or decreases the capacity). In accordance with the variation in capacity of the ink pressure chamber 14, the ink that is introduced in the ink pressure chamber 14 is discharged from the nozzle hole 21.

In the meantime, in the present embodiment, the ink-jet head 1 includes a protection film 60. The protection film 60 covers the surface of the nozzle plate 20, peripheral portions of adhesion parts AP between the piezoelectric members 13 and the nozzle plate 20, and the electrodes 16. The surface of the nozzle plate 20, in this context, includes the top surface 20T, the back surface 20B excluding the adhesion parts AP, and inner walls 21I of the nozzle holes 21.

To be more specific, the protection film 60 uniformly covers the inner surface of the ink pressure chamber 14, that is, the surface of the electrode 16, and the back surface 20B of the nozzle plate 20 at positions other than the adhesion parts AP. In addition, the protection film 60 covers the top surface 20T of the nozzle plate 20. Furthermore, the protection film 60 covers the inner wall 21I of the nozzle hole 21, and is continuous with the protection film covering the top surface 20T and the protection film covering the back surface 20B. In the example illustrated in FIG. 2, there is no part where the nozzle plate 20 is exposed from the protection film 60.

The protection film 60 is electrically insulative, and is formed of, for example, an organic material such as polyimide or parylene (polyparaxylene). In addition, the protection film 60 is formed by, for example, a dry method such as vapor-deposition polymerization.

In the vapor-deposition polymerization, a plurality of kinds of material monomers are evaporated by heat energy and activated. In this state, the material monomers are adhered to a process target which is to be covered with the protection film 60, and a polymerization reaction is caused to occur between the material monomers adhered to the process target. Thereby, the protection film 60 of an organic high-molecular-weight film is formed on the surface of the process target.

The protection film 60, which covers the surface of the nozzle plate 20, has the following shape. Specifically, at least a part of the protection film 60 is missing on at least that part of the top surface 20T of the nozzle plate 20, which corresponds to the peripheral area of the nozzle hole 21. In the example illustrated in FIG. 2, at the peripheral area of the nozzle hole 21, a recess 60C is formed in the protecting film 60 covering the top surface of the nozzle plate 20, which is a part of the surface of the nozzle plate 20. To be more specific, the film thickness of the protection film 60 covering the top surface 20T of the nozzle plate 20 locally decreases at the peripheral area of the nozzle hole 21.

For example, the protection film 60 is so formed as to generally have a first film thickness T1 (e.g. about 5 μm). The protection film 60 covering the top surface 20T generally has the first film thickness T1. For example, the protection film 60 has the first film thickness T1 immediately above the adhesion part AP, while having a second film thickness T2, which is less than the first film thickness T1, at the peripheral area of the nozzle hole 21. The region with the second film thickness T2, that is, the recess 60C, is formed, for example, in a ring shape surrounding the nozzle hole 21. As regards the protection film 60, the region with the second film thickness T2 is continuous with the region covering the inner wall 21I of the nozzle hole 21. In the meantime, the first film thickness T1 and second film thickness T2 are lengths in the third direction Z.

The above-described first structure example is applied to each of the case in which the nozzle plate 20 is formed of a resin and the case in which the nozzle plate 20 is formed of a metal.

Figure 3:
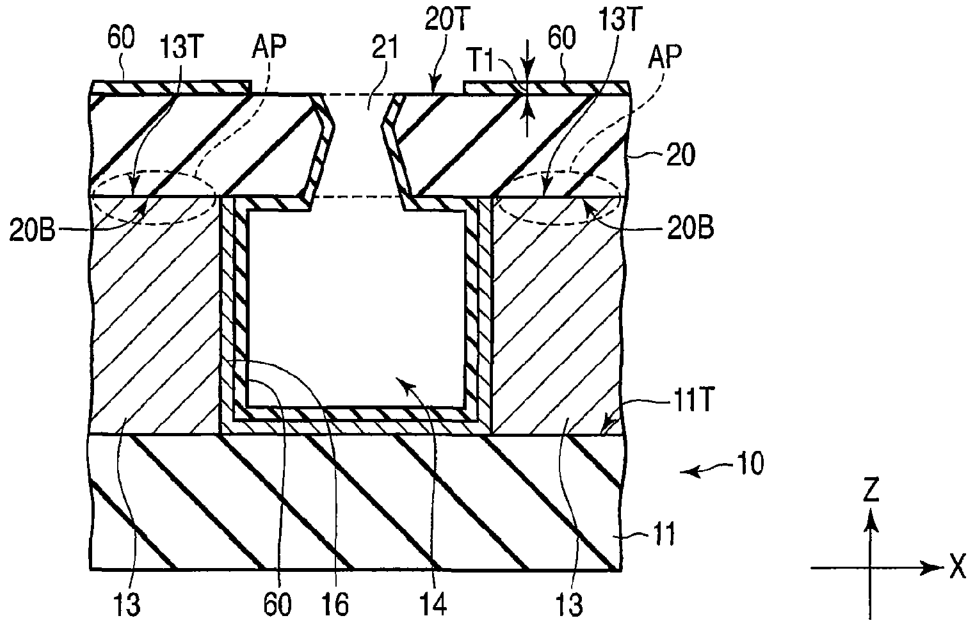
FIG. 3 is a cross-sectional view which schematically shows a second structure example including the main module and nozzle plate, which constitute the ink-jet head shown in FIG. 1.

FIG. 3 is a cross-sectional view which schematically shows a second structure example including the main module 10 and nozzle plate 20, which constitute the ink-jet head 1 shown in FIG. 1.

The second structure example shown in FIG. 3 differs from the first structure example in that at least that part of the top surface 20T of the nozzle plate 20, which corresponds to the peripheral area of the nozzle hole 21, is exposed from the protection film 60. Specifically, the protection film 60 has the first film thickness T1 immediately above the adhesion part AP, but the protection film 60 is missing at the peripheral area of the nozzle hole 21 and the film thickness thereof is zero. In other words, at the peripheral area of the nozzle hole 21, the protection film 60 is completely removed to the level of the top surface 20T, and a stepped part corresponding to the first film thickness T1 is formed. The region of the top surface 20T, which is exposed from the protection film 60, is formed, for example, in a ring shape surrounding the nozzle hole 21. The other structural parts of the second structure example are the same as those of the first structure example, so these parts are denoted by like reference numerals and a description thereof is omitted.

The above-described second structure example is applied to each of the case in which the nozzle plate 20 is formed of a resin and the case in which the nozzle plate 20 is formed of a metal.

Figure 4:
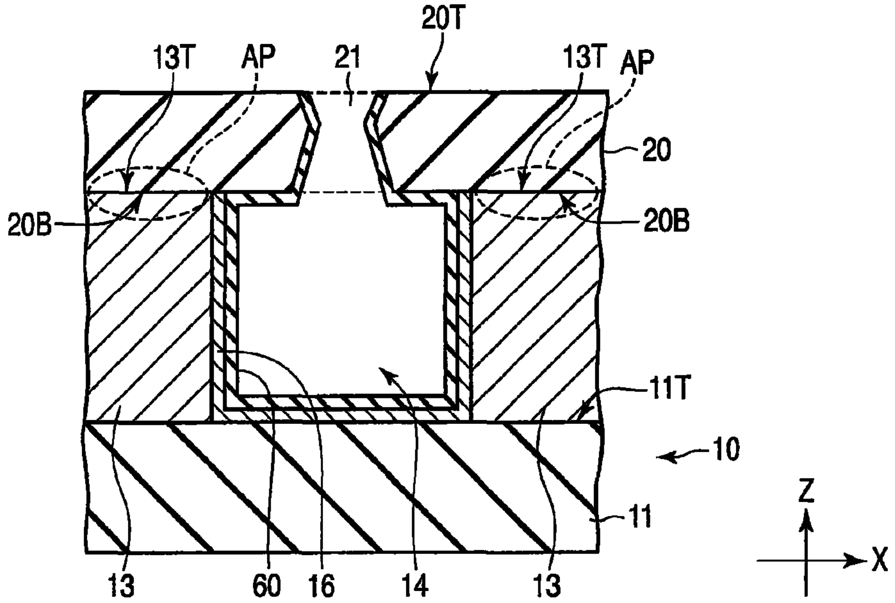
FIG. 4 is a cross-sectional view which schematically shows a third structure example including the main module and nozzle plate, which constitute the ink-jet head shown in FIG. 1.

FIG. 4 is a cross-sectional view which schematically shows a third structure example including the main module 10 and nozzle plate 20, which constitute the ink-jet head 1 shown in FIG. 1.

The third structure example shown in FIG. 4 differs from the second structure example in that the entirety of the top surface 20T of the nozzle plate 20, which includes the peripheral area of the nozzle hole 21, is exposed from the protection film 60. Specifically, in the third structure example, the protection film 60 is not formed on the top surface 20T of the nozzle plate 20. The other structural parts of the third structure example are the same as those of the first structure example, so these parts are denoted by like reference numerals and a description thereof is omitted.

The above-described third structure example is applied to each of the case in which the nozzle plate 20 is formed of a resin and the case in which the nozzle plate 20 is formed of a metal.

Figure 5:
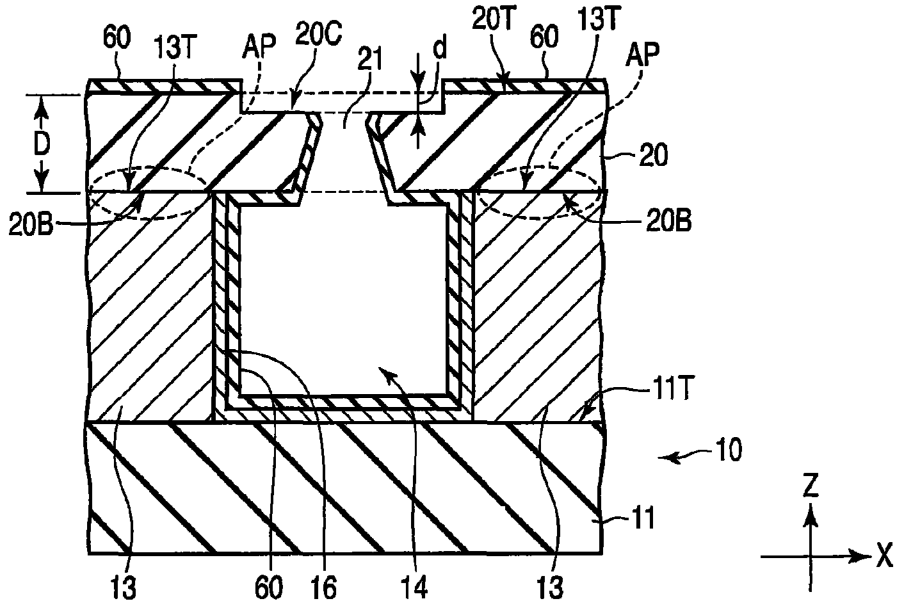
FIG. 5 is a cross-sectional view which schematically shows a fourth structure example including the main module and nozzle plate, which constitute the ink-jet head shown in FIG. 1.

FIG. 5 is a cross-sectional view which schematically shows a fourth structure example including the main module 10 and nozzle plate 20, which constitute the ink-jet head 1 shown in FIG. 1.

The fourth structure example shown in FIG. 5 differs from the second structure example in that a recess 20C is formed in that part of the nozzle plate 20, which is exposed from the protection film 60. As a matter of course, the protection film 60 is not formed in the recess 20C. The recess 20C is formed on the top surface 20T side. The depth d of the recess 20C from the top surface 20T is within 10% of the thickness D of the nozzle plate 20, or within 5 μm. The recess 20C is formed, for example, in a ring shape surrounding the nozzle hole 21. The depth d and thickness D are lengths in the third direction Z. The other structural parts of the fourth structure example are the same as those of the first structure example, so these parts are denoted by like reference numerals and a description thereof is omitted.

The above-described fourth structure example is applied, in particular, to the case in which the nozzle plate 20 is formed of a resin.

Next, a description is given of an example of the cross-sectional shape of the nozzle hole 21 which is formed in the nozzle plate 20.

Figure 6:
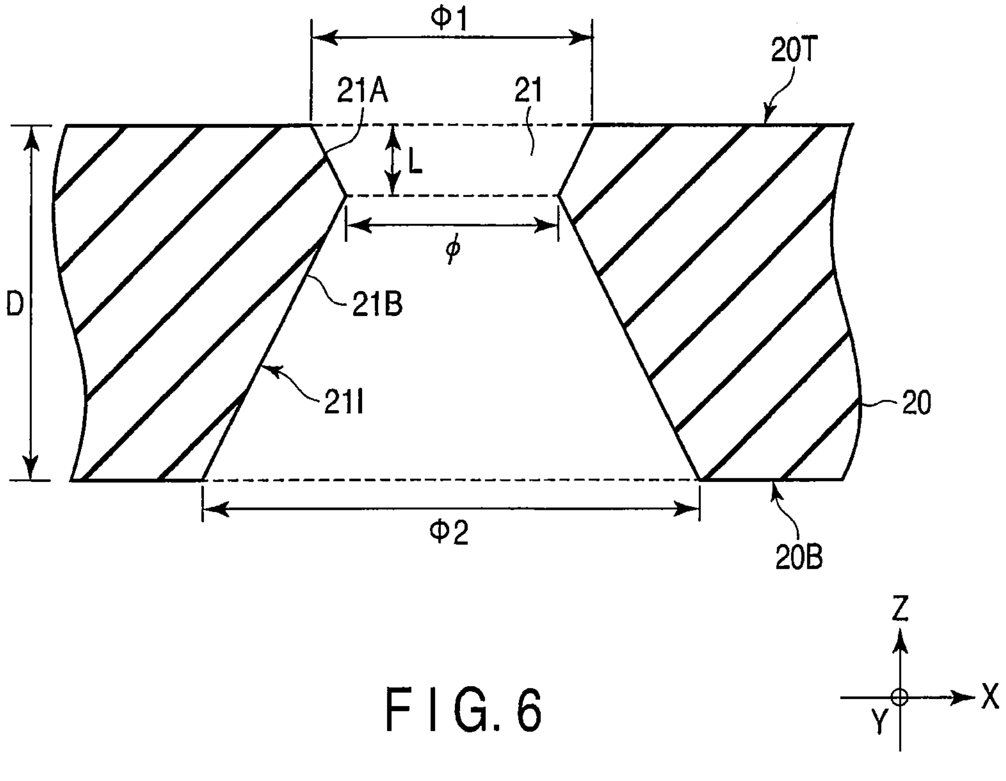
FIG. 6 is a cross-sectional view which schematically shows the shape of a nozzle hole which is formed in the nozzle plate of each of the structure examples shown in FIG. 2, FIG. 3, FIG. 4 and FIG. 5.

FIG. 6 is a cross-sectional view which schematically shows the shape of the nozzle hole 21 which is formed in the nozzle plate 20 of each of the structure examples shown in FIG. 2, FIG. 3, FIG. 4 and FIG. 5.

Specifically, the nozzle hole 21 has an hourglass-like cross-sectional shape having a minimum diameter ϕ between the top surface 20T and back surface 20B of the nozzle plate 20. In other words, the inner wall 21I of the nozzle hole 21 forms an inverted taper portion 21A on the top surface 20T side of the nozzle plate 20 and a forward taper portion 21B on the back surface 20B side of the nozzle plate 20. The nozzle hole 21 at the position of the top surface 20T has a substantially circular shape with a diameter Φ1. The nozzle hole 21 at the position of the back surface 20B has a substantially circular shape with a diameter Φ2. The diameter Φ1 is smaller than the diameter Φ2. The nozzle hole 21 at the position of the minimum diameter ϕ also has a substantially circular shape. The minimum diameter ϕ is smaller than each of the diameter Φ1 and diameter Φ2.

The position of the minimum diameter ϕ in the third direction Z is closer to the position of the top surface 20T than to the position of the back surface 20B. A distance L in the third direction Z from the top surface 20T to the position of the minimum diameter ϕ is about 10% of the thickness D of the nozzle plate 20. Examples of the dimensions of the respective parts are as follows: the thickness D is 50 μm, the distance L is 5 μm, and the minimum diameter ϕ is 30 μm.

In the structure examples shown in FIG. 2, FIG. 3 and FIG. 4, the minimum diameters of the respective nozzle holes 21 can be made uniform. In the fourth structure example shown in FIG. 5, even in the case where the recess 20C is formed on the top surface 20T side of the nozzle plate 20, if the depth d of the recess 20C is within 10% of the thickness D of the nozzle plate 20 or within 5 μm, the minimum diameter ϕ of the nozzle hole 21 is maintained. Thus, the occurrence of such a problem that the minimum diameter varies from nozzle hole 21 to nozzle hole 21 can be prevented.

In many cases, the nozzle hole 21 having the above-described shape is formed in the case where the nozzle plate 20 is formed of a resin. However, this nozzle hole 21 can also be formed in the case where the nozzle plate 20 is formed of a metal.

Another cross-sectional shape of the nozzle hole 21, which is applicable, is such that a cylindrical portion with a substantially uniform inside diameter is formed on the top surface 20T side of the nozzle plate 20, and a forward taper portion is formed on the back surface 20B side of the nozzle plate 20. Also in this case, in the structure in which the recess 20C is formed on the top surface 20T side of the nozzle plate 20, like the fourth structure example, if the depth of the recess 20C is within the length of the cylindrical portion in its axial direction, the inside diameter of the cylindrical portion becomes the minimum diameter ϕ of the nozzle hole 21 and this minimum diameter is maintained.

Next, a description is given of a method of manufacturing the ink-jet head 1 in the embodiment. The description below is given with reference to cross-sectional views in an X-Z plane.

Figure 7:
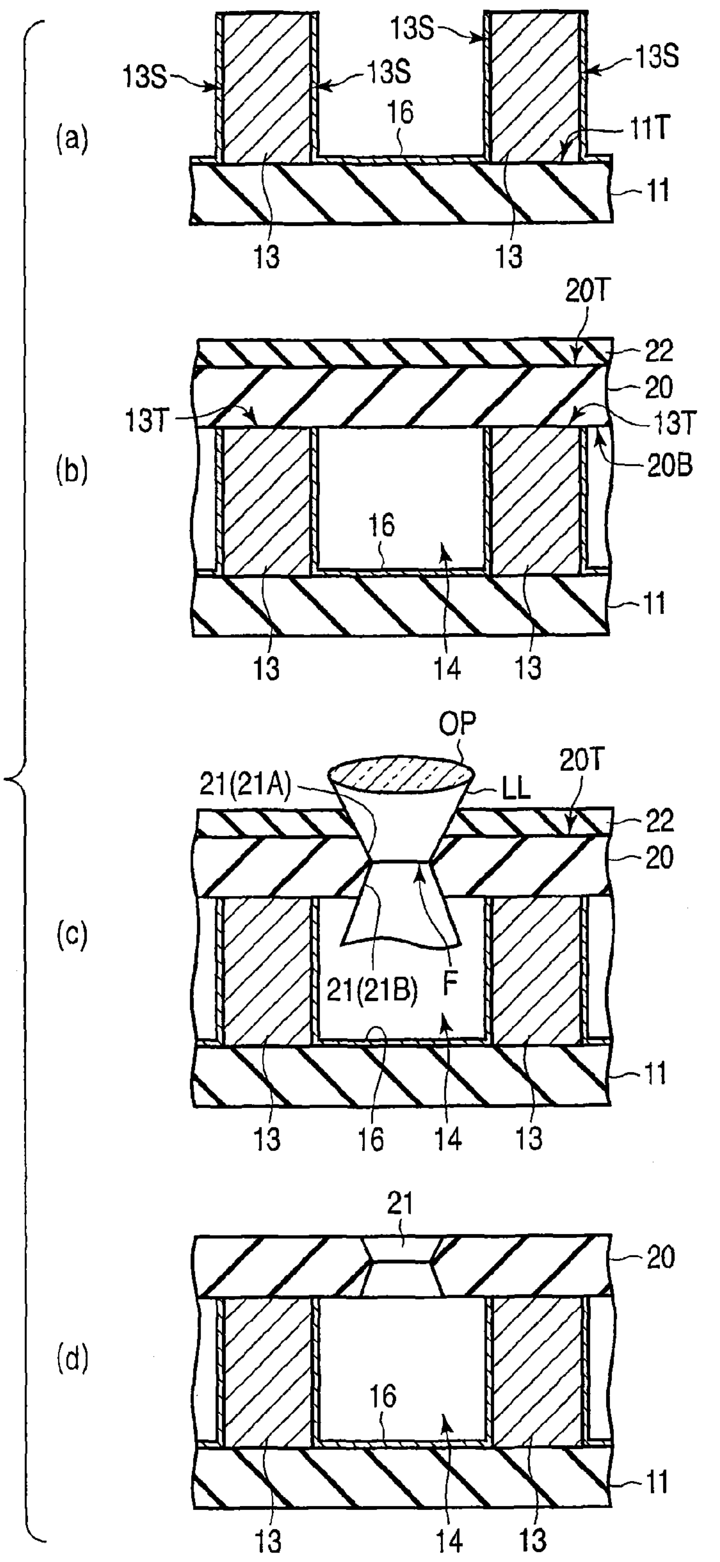
FIG. 7 includes cross-sectional views which schematically illustrate some steps of a manufacturing process of the ink-jet head of the embodiment.

FIG. 7 includes cross-sectional views which schematically illustrate some steps of a manufacturing process of the ink-jet head 1 of the embodiment.

To begin with, as shown in part (a) of FIG. 7, piezoelectric members 13 for forming an ink pressure chamber are formed on the top surface 11T of the insulative substrate 11, and subsequently an electrode 16 is disposed on side surfaces 13S of the piezoelectric members 13 and on the top surface 11T of the insulative substrate 11. At this stage illustrated, the electrode 16 is not disposed on the top surfaces 13T of the piezoelectric members 13.

As shown in part (b) of FIG. 7, the piezoelectric members 13 and the nozzle plate 20 are attached by an adhesive. The adhesive is, for example, an epoxy resin, and is applied to the top surfaces 13T of the piezoelectric members 13. The nozzle plate 20 is formed of, for example, polyimide. In the example illustrated, no nozzle hole is formed in the nozzle plate 20 which has been attached. Alternatively, a nozzle plate 20, in which a nozzle hole 21 is formed in advance, may be attached. In particular, in the case where the nozzle plate 20 is formed of a metal, it is preferable that the nozzle hole 21 is formed prior to the attachment. As methods of forming the nozzle hole 21 in the nozzle plate 20, for example, a laser process of irradiating a laser beam, a pressing process, and an electroforming process may be applied.

A description is given a method of forming the nozzle hole 21 with an hourglass-like cross-sectional shape, as shown in FIG. 6, by a laser process.

A surface protection film 22 is attached to the top surface 20T of the nozzle plate 20. The surface protection film 22 is formed, for example, such that an adhesive material is coated on a film of polyethylene terephthalate (PET). Examples of the thickness are as follows: the thickness of the nozzle plate 20 is about 50 μm, and the thickness of the surface protection film 22 is about 15 μm.

In the state in which the back surface 20B of the nozzle plate 20, to which the surface protection film 22 is attached, is opposed to the piezoelectric members 13, the nozzle plate 20 is placed on the top surfaces 13T of the piezoelectric members 13, to which the adhesive is coated. By performing a process of curing the adhesive, the nozzle plate 20 is attached to the piezoelectric members 13. At this time, since no nozzle hole is formed in the nozzle plate 20, precise alignment is not needed.

Subsequently, as shown in part (c) of FIG. 7, a laser beam LL, which is shaped by an optical system OP of a hole-processing device (not shown), is radiated on the nozzle plate 20, and a nozzle hole 21 is formed. The laser beam LL, which is used in this case, is a laser beam of a wavelength in the ultraviolet range, which is emitted from, e.g. an excimer laser device or a YAG laser device, and which can remove the material of the nozzle plate 20. If the laser beam LL has passed through the telecentric optical system OP of the hole-processing device, the laser beam LL is shaped in such an hourglass-like beam shape that the diameter of the laser beam LL gradually decreases toward a focal plane F in the cross section perpendicular to the direction of travel of the laser beam LL, and then gradually increases away from the focal plane F.

An inverted taper portion 21A and a forward taper portion 21B are formed by performing processing while positioning the focal plane F of the laser beam LL of the hourglass-like beam shape within the cross section of the nozzle plate 20. Then, the surface protection film 22 is peeled from the top surface 20T of the nozzle plate 20.

Thereby, as shown in part (d) of FIG. 7, the nozzle hole 21 having the hourglass-like cross-sectional shape is formed in the nozzle plate 20. The nozzle hole 21, which is thus formed, communicates with the ink pressure chamber 14.

Subsequently, the protection film 60, which covers the surface of the nozzle plate 20, the peripheral portions of the adhesion parts AP between the piezoelectric members 13 and nozzle plate 20, and the electrode 16, is formed.

Figure 8:
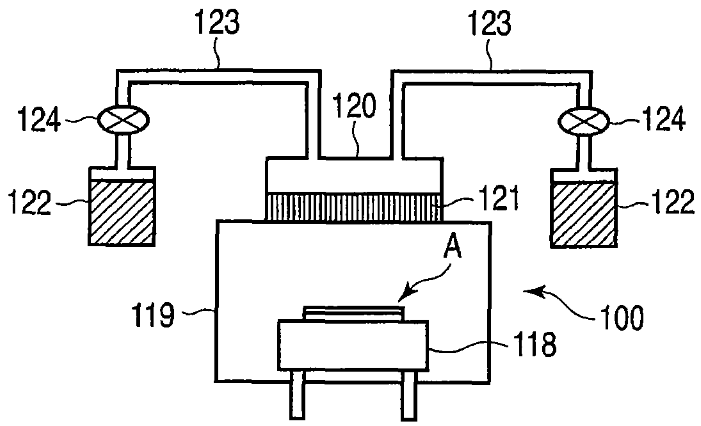
FIG. 8 schematically shows the structure of a vapor-deposition polymerization apparatus for forming a protection film in the ink-jet head of the embodiment.

FIG. 8 schematically shows the structure of a vapor-deposition polymerization apparatus 100 for forming the protection film 60 in the ink-jet head 1 of the embodiment. The schematic structure of the vapor-deposition polymerization apparatus 100 and the procedure of vapor-deposition polymerization are described with reference to FIG. 8.

The vapor-deposition polymerization apparatus 100 includes a chamber 119. A stage 118 is provided within the chamber 119. The stage 118 holds a process target A (in this embodiment, the structure shown in part (d) of FIG. 7) on which the protection film 60 is to be formed by a vapor-deposition polymerization method. The stage 118 is provided with a temperature adjusting mechanism for adjusting the temperature of the process target A.

An inside temperature control mechanism for controlling the temperature within the chamber 119 is provided within the chamber 119. In addition, the chamber 119 is provided with a pressure-reducing mechanism for reducing the pressure within the chamber 119. This pressure-reducing mechanism may be such a mechanism as to forcibly exhaust the air within the chamber 119 to the outside of the chamber 119 by means of, for example, a fan.

A mixing bath 120 is provided on the upper side of the chamber 119. The chamber 119 and the mixing bath 120 are made to communicate with each other via a shower plate 121 in which a plurality of holes are formed.

In addition, the vapor-deposition polymerization apparatus 100 is provided with a plurality of evaporation baths 122 containing material monomers which are to be adhered to the process target A. Each of the evaporation baths 122 is provided with a heating mechanism which heats the material monomers. In addition, each evaporation bath 122 is provided with a monomer introducing conduit 123 for establishing communication between the evaporation bath 122 and the mixing bath 120. Each monomer introducing conduit 123 is provided with a valve 124 which controls the opening/closing of the monomer introducing conduit 123. The monomer introducing conduit 123 is closed by the valve 124 at times other than when vapor-deposition polymerization is performed.

When the protection film 60 is to be formed, the process target A is first attached to the stage 118. The parts (e.g. electrode terminals) of the process target A, on which the formation of the protection film 60 is needless, are masked in advance.

Subsequently, the inside of the evaporation bath 122 is heated by the heating mechanism. The heated material monomers are evaporated as a gas. When the material monomers are sufficiently evaporated, the valve 124 is opened to open the monomer introducing conduit 123. Thereby, the evaporated material monomers are introduced into the mixing bath 120 through the monomer introducing conduit. In the mixing bath 120, mixed monomers, in which various kinds of monomers are uniformly mixed, are generated.

In addition, the pressure within the chamber 119 is reduced by the pressure-reducing mechanism. The mixed monomers are introduced into the chamber 119 via the shower plate 121 by the pressure difference between the mixing bath 120 and the chamber 119.

The mixed monomers, which have been introduced in the chamber 119, adhere to the parts of the process target A, on which the protection film 60 is to be formed. By controlling the temperature of the process target A and the temperature within the chamber 119, the material monomers adhering to the process target A begin to polymerize. Thereby, the protection film 60, which is the object of the process, is formed on the parts (the surface of the nozzle plate 20, the peripheral portion of the adhesion part AP between the piezoelectric member 13 and nozzle plate 20, and the electrode 16) of the process target A, on which the protection film 60 is to be formed.

In the above-described vapor-deposition polymerization method, the substance to be formed is adhered to the process target A in units of a monomer, and then the monomers are polymerized on the surface of the process target A. Thus, even in the case where the process target A has a complex shape, monomer molecules can uniformly reach fine parts of the process target A, and the protection film with uniform thickness can be formed on fine parts regardless of the shape of the process target A. Besides, the vapor-deposition polymerization method has such features as good adhesion and high throwing power. Therefore, by forming the protection film 60 by the vapor-deposition polymerization method, an underlayer treatment of the process target A, for instance, can be made needless.

Figure 9:
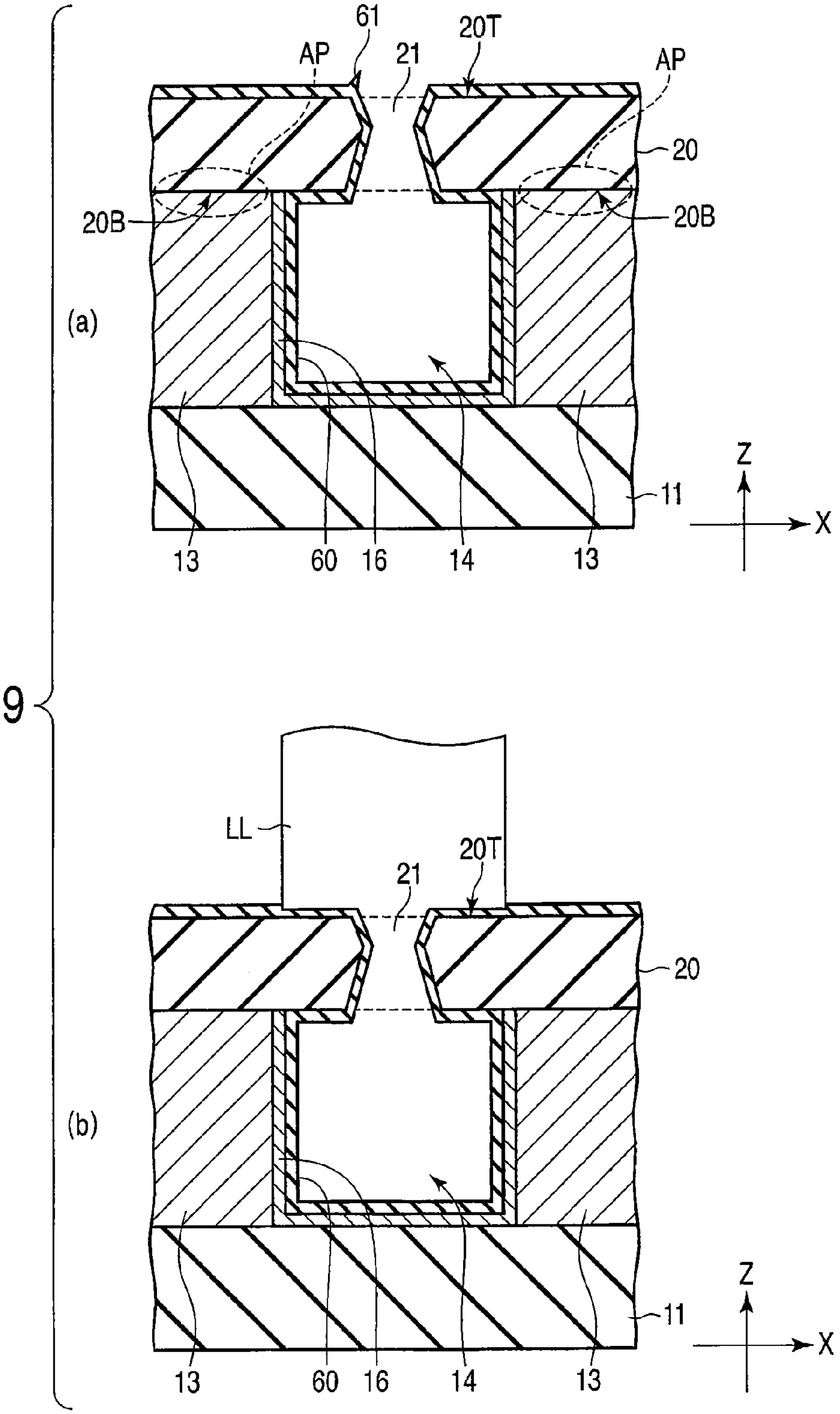
FIG. 9 includes cross-sectional views which schematically illustrate some steps of the manufacturing process of the ink-jet head of the embodiment.

FIG. 9 includes cross-sectional views which schematically illustrate some steps of the manufacturing process of the ink-jet head of the embodiment.

As shown in part (a) of FIG. 9, when the protection film 60 has been formed by the vapor-deposition polymerization method, the protection film 60 covers the surface of the nozzle plate 20 (i.e. the top surface 20T, the back surface 20B, and the inner wall 21I of the nozzle 21), the peripheral portion of the adhesion part AP between the piezoelectric member 13 and nozzle plate 20, and the electrode 16. At this time, as shown in part (a) of FIG. 9, there is a case in which a projection 61 of the protection film 60 forms due to local abnormal growth of the protection film 60.

As shown in part (b) of FIG. 9, the laser beam LL is radiated on the nozzle plate 20, and at least at the peripheral area of the nozzle hole 21, at least a part of the protection film 60 covering the top surface 20*t* of the nozzle plate 20 is removed. Thereby, even if the projection 61 forms on the protection film 60, the projection 61 is substantially removed by the radiation of the laser beam LL.

The laser beam LL, which is used in this case, is a laser beam of a wavelength in the ultraviolet range, which is emitted from, e.g. an excimer laser device or a YAG laser device, and which can remove an organic material which is the material of the protection film 60. At this time, the laser beam LL may selectively be radiated on the peripheral area of the nozzle hole 21, or the laser beam LL with a large diameter may be radiated on the entirety of the top surface 20T of the nozzle plate 20, or the laser beam LL with a small diameter may be radiated and scanned over almost the entirety of the top surface 20T of the nozzle plate 20.

The amount of removal of the protection film 60 (or the depth of recessing of the protection film 60 in the third direction Z) is adjusted by controlling the amount of radiation of the laser beam LL on the protection film 60. The amount of radiation of the laser beam LL is controlled by, e.g. the energy density or radiation time per shot, or the number of shots.

In the case where the nozzle plate 20 is formed of a resin, if the amount of radiation of the laser beam LL is excessively large, the laser beam LL would remove not only the protection film 60 on the top surface 20T of the nozzle plate 20, but also would penetrate the nozzle plate 20 from the top surface 20T to the back surface 20*b*. Thus, in the case where the nozzle plate 20 is formed of a resin, the amount of radiation of the laser beam LL is set so that the laser beam LL may not penetrate the nozzle plate 20 from the top surface 20T to the back surface 20B.

On the other hand, in the case where the nozzle plate 20 is made of a metal having sufficient heat resistance (or resistant to a laser beam) to the heat of the laser beam LL, even if the amount of radiation of the laser beam LL is somewhat excessive, it is little possible that the laser beam LL removes part of the nozzle plate 20 or penetrates the nozzle plate 20 from the top surface 20T to the back surface 20B. Thus, in the case where the nozzle plate 20 is made of a metal, compared to the case where the nozzle plate 20 is made of a resin, it is possible to remove a necessary amount of the protection film 60, without strictly controlling the amount of radiation of the laser beam LL.

In the case where the amount of radiation of the laser beam LL is set, regardless of the material of the nozzle plate 20, at a first radiation amount which is necessary to remove, by the first film thickness T1, the protection film 60 formed on the top surface 20T of the nozzle plate 20, the protection film 60 is selectively removed by selectively radiating the laser beam LL on the peripheral area of the nozzle hole 21. Thereby, as in the second structure example shown in FIG. 3, that part of the top surface 20T of the nozzle plate 20, which corresponds to the periphery of the nozzle hole 21, is exposed from the protection film 60.

Similarly, in the case where the amount of radiation of the laser beam LL is set at the first radiation amount regardless of the material of the nozzle plate 20, the protection film 60 covering the top surface 20T is removed by radiating the laser beam LL on the entirety of the top surface 20T of the nozzle plate 20. Thereby, as in the third structure example shown in FIG. 4, the entirety of the top surface 20T of the nozzle plate 20 is exposed from the protection film 60.

In the case where the amount of radiation of the laser beam LL is set, regardless of the material of the nozzle plate 20, at an amount which is smaller than the first radiation amount, the protection film 60 is selectively removed by selectively radiating the laser beam LL on the peripheral area of the nozzle hole 21. Thereby, as in the first structure example shown in FIG. 2, the recess 60C is formed at the peripheral area of the nozzle hole 21.

In the case where the nozzle plate 20 is formed of a resin and the amount of radiation of the laser beam LL is set at an amount which is greater than the first radiation amount, the protection film 60 is selectively removed and a part of the nozzle plate 20 on the top surface 20T side is removed by selectively radiating the laser beam LL on the peripheral area of the nozzle hole 21. Thereby, as in the fourth structure example shown in FIG. 5, the recess 20C is formed on the top surface 20T side of the nozzle plate 20.

As has been described above, in the ink-jet head 1 of the present embodiment, the electrode 16, which is formed in the ink pressure chamber 14, and the peripheral portion of the adhesion part AP between the piezoelectric member 13 and the nozzle plate 20 are covered with the protection film 60. Therefore, in the ink-jet head 1 which discharges various kinds of ink, it is possible to protect, by the protection film 60, the parts, such as the adhesive for attaching the piezoelectric member 13 and nozzle plate 20, which have poor ink-resistance properties.

In other words, since the electrode 16 and adhesive are not put in contact with ink, there is no need to consider ink-resistance properties of these parts, and the number of kinds of selectable materials for these parts can be increased. Moreover, as regards the ink, there is no need to consider the influence on the electrode 16 and adhesive, and various kinds of ink can be applied.

In particular, there is a tendency that a thermosetting adhesive is avoided as the adhesive for attaching the metal-made nozzle plate 20, in which nozzle holes 21 are formed in advance, to the piezoelectric members 13. The reason is that positional displacement may easily occur due to thermal expansion of the nozzle plate 20 at the time of heat curing. Thus, the materials that are selectable for the adhesive are limited. If the ink-resistance properties of the adhesive are taken into account, the selectable materials are further limited. In the present embodiment, the adhesive is protected by the protection film 60 and is not put in contact with ink. Therefore, the limitation to the kinds of materials, which are selectable for the adhesive, can be relaxed.

At the peripheral area of the nozzle hole 21, at least a part of the protection film 60 covering the top surface 20T of the nozzle plate 20 is missing. This is because at least a part of the protection film 60 has been removed by radiating the laser beam LL, after the process of forming the protection film 60. Thus, in the process of forming the protection film 60, even if a part of the protection film 60 abnormally grows into the projection 61 at the edge part of the nozzle hole 21, the projection 61 can also be removed in the process of removing the protection film 60.

Therefore, the influence of the abnormal growth of the protection film 60 can be reduced. Thereby, it is possible to suppress the occurrence of an inclination of the direction of discharge of ink which is discharged from the nozzle hole 21, or the occurrence of defective print due to the occurrence of a satellite, and to suppress the degradation of print quality.

Depending on the size of the abnormally grown projection 61, there is a case in which the projection 61 cannot completely be removed by the radiation of the laser beam LL. Even in such a case, the projection 61 is made gentler and substantially leveled, and the influence at the time of discharging ink can be reduced.

In the first structure example illustrated in FIG. 2, the recess 60C is formed in that part of the protection film 60 covering the top surface 20T of the nozzle plate 20, which corresponds to the peripheral area of the nozzle hole 21. In the first structure example, the projection 61 of the protection film 60, which has abnormally grown at the peripheral area of the nozzle hole 21, can be removed in the process of forming the recess 60C. Thus, the effect of suppressing the degradation in print quality can be obtained. In addition, by limiting the area of radiation of the laser beam LL to the peripheral area of the nozzle hole 21, the number of steps in the laser radiation process can be reduced.

In the second structure example shown in FIG. 3 and the third structure example shown in FIG. 4, at least that part of the top surface 20T of the nozzle plate 20, which corresponds to the peripheral area of the nozzle hole 21, is exposed from the protection film 60. In the second structure example, the projection 61 of the protection film 60, which has abnormally grown at the peripheral area of the nozzle hole 21, can be removed in the process of removing the protection film 60. In the second structure example, compared to the first structure example, the ratio of removal of the projection 61 is increased. Therefore, the influence due to the projection 61 can further be reduced, and the effect of suppressing the degradation in print quality can be obtained. In addition, the number of steps in the laser radiation process can be reduced in the second structure example in which the area of radiation of the laser beam LL is limited to the peripheral area of the nozzle hole 21, compared to the third structure example in which the area of radiation of the laser beam LL is the entirety of the top surface 20T of the nozzle plate 20.

In the fourth structure example shown in FIG. 5, the peripheral area of the nozzle hole 21 is exposed from the protection film 60, and moreover the recess 20C is formed in that part of the nozzle plate 20, which is exposed from the protection film 60. In the fourth structure example, the projection 61 of the protection film 60, which has abnormally grown at the peripheral area of the nozzle hole 21, can be removed in the process of removing the parts of the protection film 60 and nozzle plate 20. In the fourth structure example, compared to the second structure example and third structure example, the ratio of removal of the projection 61 is further increased. Therefore, the influence due to the projection 61 can further be reduced, and the effect of suppressing the degradation in print quality can be obtained. In addition, by limiting the area of radiation of the laser beam LL to the peripheral area of the nozzle hole 21, the number of steps in the laser radiation process can be reduced.

As has been described above, according to the present embodiment, it is possible to provide the ink-jet head which can suppress the degradation in print quality, and the method of manufacturing the ink-jet head.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An ink-jet head comprising:

a piezoelectric member which forms an ink pressure chamber;

an electrode disposed on a side surface of the piezoelectric member;

a nozzle plate attached to the piezoelectric member, the nozzle plate including a nozzle hole communicating with the ink pressure chamber, a top surface, a back surface, and an inner wall; and a protection film which covers the top surface of the nozzle plate, the back surface of the nozzle plate, the inner wall of the nozzle plate, a peripheral portion of an adhesion part between the piezoelectric member and the nozzle plate, and the electrode, the protection film including a recess formed in a part of the protection film covering the top surface of the nozzle plate, the part of the protection film corresponding to a peripheral area of the nozzle hole.

2. The ink-jet head of claim 1, wherein the protection film covering the top surface of the nozzle plate has a first film thickness immediately above the adhesion part and a second film thickness at the recess, the second film thickness being smaller than the first film thickness.

3. The ink-jet head of claim 1, wherein the nozzle hole has an hourglass-like cross-sectional shape having a minimum diameter between the top surface and the back surface of the nozzle plate.

4. The ink-jet head of claim 3, wherein in the nozzle hole, a distance from the top surface of the nozzle plate to a position of the minimum diameter is 10% of a thickness of the nozzle plate.

5. The ink-jet head of claim 1, wherein the nozzle plate is formed of a resin or a metal.

6. The ink-jet head of claim 1, wherein the protection film is formed of an electrically insulative organic material.

7. An ink-jet head comprising:

a piezoelectric member which forms an ink pressure chamber;

an electrode disposed on a side surface of the piezoelectric member;

a nozzle plate attached to the piezoelectric member, the nozzle plate including a nozzle hole communicating with the ink pressure chamber, a top surface, a back surface, and an inner wall; and a protection film which covers the top surface of the nozzle plate, the back surface of the nozzle plate, the inner wall of the nozzle plate, a peripheral portion of an adhesion part between the piezoelectric member and the nozzle plate, and the electrode, wherein at least a part of the top surface of the nozzle plate is not covered by the protection film, the part of the top surface corresponding to a peripheral area of the nozzle hole.

8. The ink-jet head of claim 7, wherein a recess is formed in the part of the nozzle plate which is not covered by the protection film.

9. The ink-jet head of claim 8, wherein a depth of the recess is within 10% of a thickness of the nozzle plate.

10. The ink-jet head of claim 7, wherein the nozzle hole has an hourglass-like cross-sectional shape having a minimum diameter between the top surface and the back surface of the nozzle plate.

11. The ink-jet head of claim 10, wherein in the nozzle hole, a distance from the top surface of the nozzle plate to a position of the minimum diameter is 10% of a thickness of the nozzle plate.

12. The ink-jet head of claim 8, wherein the nozzle plate is formed of a resin.

13. The ink-jet head of claim 7, wherein the nozzle plate is formed of a metal.

14. The ink-jet head of claim 7, wherein the protection film is formed of an electrically insulative organic material.

* * * * *